United States Patent
Gallup et al.

(10) Patent No.: US 6,982,437 B2
(45) Date of Patent: Jan. 3, 2006

(54) SURFACE EMITTING LASER PACKAGE HAVING INTEGRATED OPTICAL ELEMENT AND ALIGNMENT POST

(75) Inventors: Kendra Gallup, Marina Del Rey, CA (US); Brenton A. Baugh, Palo Alto, CA (US); Robert E. Wilson, Palo Alto, CA (US); James A. Matthews, Milpitas, CA (US); James H. Williams, Walnut Creek, CA (US); Tak Kui Wang, Saratoga, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/665,662

(22) Filed: Sep. 19, 2003

(65) Prior Publication Data

US 2005/0062055 A1  Mar. 24, 2005

(51) Int. Cl.
 *H01L 33/00* (2006.01)
 *H01L 31/0232* (2006.01)

(52) U.S. Cl. .............. 257/100; 257/432; 257/434; 385/88; 372/101; 372/107

(58) Field of Classification Search .......... 257/81, 257/95, 99–100, 432–435; 385/88–93; 372/101, 372/107
See application file for complete search history.

(56) References Cited

U.S. PATENT DOCUMENTS

| | | | |
|---|---|---|---|
| 5,835,514 A * | 11/1998 | Yuen et al. ............. | 372/36 |
| 5,875,205 A | 2/1999 | Spaeth et al. | |
| 5,981,945 A | 11/1999 | Spaeth et al. | |
| 6,228,675 B1 | 5/2001 | Ruby et al. | |
| 6,265,246 B1 | 7/2001 | Ruby et al. | |
| 6,274,890 B1 * | 8/2001 | Oshio et al. ............. | 257/98 |
| 6,376,280 B1 | 4/2002 | Ruby et al. | |
| 6,429,511 B2 | 8/2002 | Ruby et al. | |
| 6,556,608 B1 | 4/2003 | Gilliland et al. | |
| 2003/0116825 A1 | 6/2003 | Geefay et al. | |
| 2003/0119308 A1 | 6/2003 | Geefay et al. | |
| 2003/0160256 A1 * | 8/2003 | Durocher et al. ....... | 257/88 |

OTHER PUBLICATIONS

Chien Chieh Lee et al., "Silicon-Based Transmissive Diffractive Optical Element ", Optics Letters, vol. 28, No. 14 Jul. 15, 2003, Optical Society of America, pp. 1260-1262.
U.S. Patent Application Serial No. 10/210,598 filed Jul. 31, 2002 entitled "Optical Fiber Coupler Having A Relaxed Alignment Tolerance, "Inventor: Christopher L. Coleman, 17 pages.

(Continued)

*Primary Examiner*—Tom Thomas
*Assistant Examiner*—Joseph Nguyen

(57) ABSTRACT

A package for a surface-emitting laser encloses the die between a sub-mount and a cap. The sub-mount and the cap can be formed using wafer processing techniques that permit a wafer level packaging process which attaches multiple die to a sub-mount wafer, attaches caps either separated or as part of a cap wafer to the sub-mount wafer, and cuts the structure to separate individual packages. The cap includes a transparent plate that can be processed to incorporate an optical element such as a lens. An alignment post attached to the cap indicates the position of an optical signal from the laser and fits snugly into one end of a sleeve while an optical fiber connector fits into the other end.

9 Claims, 3 Drawing Sheets

OTHER PUBLICATIONS

U.S. Patent Application Serial No. 10/208,570 filed Jul. 30, 2002 entitled "Diffractive Optical Elements And Methods of Making the Same ", Inventors: James A. Matthews, Wayne H. Grubbs, 18 pages.

U.S. Patent Application Serial No. 10/277,479 filed 10/22/2002 entitled "Method for Sealing a Semiconductor Device and Apparatus Embodying the Method", Inventor: Frank S. Geefay, 15 pages.

* cited by examiner

SURFACE EMITTING LASER PACKAGE HAVING INTEGRATED OPTICAL ELEMENT AND ALIGNMENT POST

This patent document is related to and hereby incorporates by reference in their entirety the following co-filed U.S. patent applications: Ser. No. 10/666,319, entitled "Alignment Post for Optical Subassemblies Made With Cylindrical Rods, Tubes, Spheres, or Similar Features"; Ser. No. 10/666,363, entitled "Wafer Level Packaging of Optoelectronic Devices"; Ser. No. 10/666,442, entitled "Integrated Optics and Electronics"; Ser. No. 10/666,444, entitled "Methods to Make Diffractive Optical Elements"; Ser. No. 10/666,091, entitled "Optoelectronic Device Packaging With Hermetically Sealed Cavity and Integrated Optical Element"; Ser. No. 10/665,680, entitled "Optical Device Package With Turning Mirror and Alignment Post"; and Ser. No. 10/665,660, entitled "Optical Receiver Package".

BACKGROUND

Optoelectronic devices such as laser diodes for optical transceivers can be efficiently fabricated using wafer processing techniques. Generally, wafer processing techniques simultaneously form a large number (e.g., thousands) of devices on a wafer. The wafer is then sawed or cut to separate individual chips. Simultaneous fabrication of a large number of chips keeps the cost per chip low, but each individual chip must be packaged and/or assembled into a system that protects the chip and provides both electrical and optical interfaces for use of the devices on the chip.

Assembly of a package or a system containing an optoelectronic device is often costly because of the need to align multiple optical components with the semiconductor device. For example, the transmitting side of an optical transceiver chip may include a vertical cavity surface emitting laser (VCSEL) that emits an optical signal in a direction perpendicular to the face of the VCSEL. A lens or other optical element is typically necessary to focus or alter the optical signal from the laser and improve coupling of the optical signal into an external optical fiber. The laser, the lens, and an optical fiber can be aligned during an assembly process that produces an optical subassembly (OSA). The alignment process can be a time consuming/expensive process that involves adjusting the relative position of the laser while measuring the optical power coupled into the fiber. The relative positions of the laser, lens, and optical fiber are locked once optical coupling efficiency is at a maximum or acceptable level. Mechanisms for adjusting and locking the relative position of the laser can increase the cost and complexity of an OSA. Further, the alignment and assembly processes generally must be performed separately for each package.

Wafer-level packaging is a promising technology for reducing the size and the cost of the packaging of optoelectronic devices. With wafer-level packaging, components that conventionally have been separately formed and attached are instead fabricated on a wafer that corresponds to multiple packages. The resulting structure can be sawed or cut to separate individual packages. Packaging techniques and structures that can reduce the size and/or cost of packaged optoelectronic devices are sought.

SUMMARY

In accordance with an aspect of the invention, a package containing a surface emitting laser or VCSEL includes a cap with an integrated optical element such as a lens. The cap can have a two-piece structure including a spacer ring having an opening defining a cavity and lid substrate that includes the integrated optical element.

The cap can attach to a sub-mount that provides electrical connections to the laser so as to form a hermetically sealed cavity that protects the laser from the environment. An alignment post can be attached (e.g., glued or epoxied) to the cap at the location at which an optical signal traverses the cap. This optical sub-assembly (OSA) can then be further assembled by fitting the alignment post into one end of a matching sleeve and an optical ferrule into the other end of the sleeve. The ferrule houses an optical fiber. With the optical fiber abutting the alignment post, the sleeve holds the ferrule in position for efficient coupling of the optical signal into the fiber.

One exemplary embodiment of the invention is an assembly including a surface-emitting laser, a sub-mount, and a cap. The laser emits an optical signal from its top face. The sub-mount contains traces that are electrically connected to the laser. The cap is attached to the sub-mount so as to form a cavity (preferably a hermetically sealed cavity) enclosing the laser and includes an optical element in the path of the optical signal. The traces in the sub-mount generally electrically connect internal bonding pads that are within the cavity and connected to the chip to terminals that are accessible outside the cavity.

One embodiment of the cap includes a spacer ring attached to the sub-mount and a plate attached to the spacer ring. The spacer ring can be formed from a silicon substrate, which may be opaque to the optical signal, while the plate is made of glass or another material that is transparent to the optical signal. An optical element can be integrated in or attached to the plate. A post can be attached to the cap at a position that is aligned with a path of the optical signal through the cap.

Another specific embodiment of the invention is a packaging process. The packaging process includes electrically connecting chips respectively to sub-mount areas of a first wafer. Each chip emits an optical signal from its top surface. Caps are bonded to the first wafer. Each cap can include a spacer having a hole and a plate that is transparent to the optical signals and incorporates an optical element. The caps can be respective areas of a second wafer, so that bonding the caps to the sub-mounts corresponds to bonding the second wafer to the first wafer. The chips are then enclosed in respective cavities between the first wafer and the respective caps, and for each of the chips, the optical element in the corresponding cap is positioned to receive the optical signal from the chip. It is then possible to saw or cut the resulting structure to separate individual packages containing the chips.

The caps can be fabricated by: forming an etch stop layer top surface on a semiconductor substrate; forming a plurality of optical elements overlying the etch stop layer; attaching a transparent plate overlying the optical elements; and forming holes through the semiconductor substrate beneath the optical elements.

BRIEF DESCRIPTION OF THE DRAWINGS

Use of the same reference symbols in different figures indicates similar or identical items.

DETAILED DESCRIPTION

In accordance with an aspect of the invention, a package containing an optoelectronic device includes a sub-mount and a cap with an integrated optical element for an optical signal from the optoelectronic device. The sub-mount and the cap can be formed using wafer-processing techniques, and the cap can include a lid substrate that is processed to include the optical element. The optical element focuses the optical signal from the optoelectronic device for coupling into another optical device or an optical fiber.

A wafer-level fabrication process for these packages attaches a first wafer, which includes multiple caps, to a second wafer, which includes multiple sub-mounts. The optoelectronic devices reside in multiple cavities formed by the bonding of the wafers. The cavities can be hermetically sealed to protect the enclosed optoelectronic devices. The structure including the bonded wafers is sawed or cut to separate individual packages.

Figure 1:
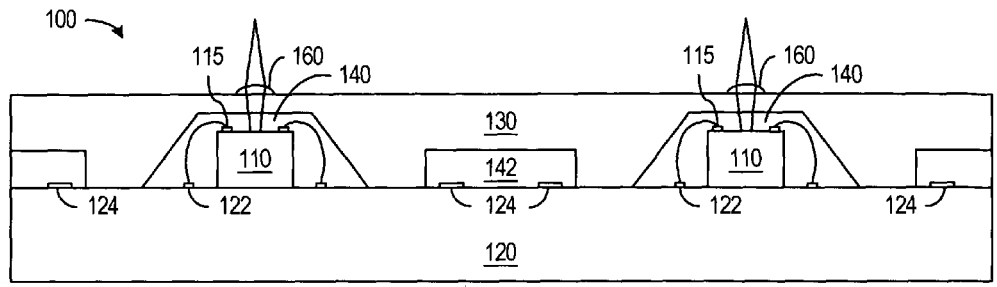
FIG. 1 shows a cross-section of a portion of a structure formed during a wafer-level packaging process for optoelectronic devices in accordance with an embodiment of the invention employing wire bonding for electrical connections.

FIG. 1 shows a structure 100 produced during a wafer-level packaging process in accordance with one embodiment of the invention. Structure 100 includes multiple vertical cavity surface-emitting lasers (VCSEL) 110. Lasers 110 can be of a conventional design and manufactured using techniques that are well known in the art. In one specific embodiment, each laser 110 has a transmitting section including a surface-emitting laser.

Each laser 110 is within one of the cavities 140 formed between a sub-mount wafer 120 and a cap wafer 130. In the embodiment of FIG. 1, lasers 110 are attached and electrically connected to sub-mount wafer 120, but lasers 110 could alternatively be attached to cap wafer 130. Lasers 110 can be glued or otherwise affixed in the desired location using conventional die attach equipment. In structure 100, wire bonding connects bonding pads 115 on lasers 110 to internal bonding pads 122 on sub-mount wafer 120.

Sub-mount wafer 120 includes circuit elements such as bonding pads 122 and electrical traces or vias (not shown) that connect lasers 110 to external terminals 124. FIG. 1 shows an embodiment where external terminals 124 are on the top surface of sub-mount wafer 120, but alternatively external terminals could be provided on a bottom surface of the sub-mount wafer. Additionally, active devices (not shown) such as transistors, an amplifier, a photodiode, or a monitor/sensor can be incorporated in sub-mount wafer 120.

Cap wafer 130 is fabricated to include depressions or cavities 140 in areas corresponding to lasers 110 on sub-mount wafer 120. Wafer 130 can be made of silicon, quartz, or any material that is transparent to the optical signal and is suitable for formation of cavities 140. Cavities 140 can be formed in a variety of ways including but not limited to forming, coining, ultrasonic machining, and (isotropic, anisotropic, or plasma) etching.

Optical elements 160 such as lenses or prisms can be attached to or integrated into cap wafer 130 along the paths of the optical signals from lasers 110. In FIG. 1, optical elements 160 are lenses that are attached to wafer 130 and serve to focus the optical signals for better coupling into an optical fiber or another optical device not shown in FIG. 1. U.S. patent application Ser. No. 10/210,598, entitled "Optical Fiber Coupler having a Relaxed Alignment Tolerance," discloses bifocal diffractive lenses suitable for optical elements 160 when coupling of the optical signals into optical fibers is desired.

Sub-mount wafer 120 and cap wafer 130 are aligned and bonded together. A variety of wafer bonding techniques including but not limited to soldering, bonding by thermal compression, or bonding with an adhesive are known and could be employed for attaching wafers 120 and 130. In the exemplary embodiment of the invention, soldering using a gold/tin eutectic solder attaches wafers 120 and 130 to each other and hermetically seals cavities 140. Hermetic seals on cavities 140 protect the enclosed chips 110 from environmental damage.

After wafers 120 and 130 are bonded, structure 100 can be sawed or cut to produce individual packages, each including a laser 110 hermetically sealed in a cavity 140. As illustrated in FIG. 1, saw channels 142 can be formed in cap wafer 140 to permit sawing of wafer 130 over external terminals 124, without damaging external terminals 142. Sub-mount wafer 120 can then be cut to separate individual packages.

Figure 2:
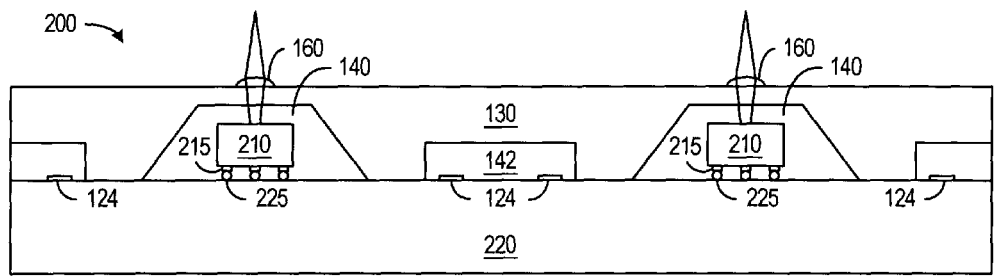
FIG. 2 shows a cross-section of a portion of a structure formed during a wafer-level packaging process for semiconductor optical devices in accordance with an embodiment of the invention employing flip-chip structures for electrical connections.

FIG. 2 illustrates a structure 200 in accordance with an alternative embodiment of the invention that uses flip-chip structures to attach chips 210 to a sub-mount wafer 220. For flip-chip packaging, bonding pads 215 on chips 210 are positioned to contact conductive pillars or bumps 225 on sub-mount wafer 220. Bumps 225 generally contain solder that can be reflowed to physically and electrically attach chips 210 to wafer 220. An underfill (not shown) can also be used to enhance the mechanical integrity between laser 210 and sub-mount wafer 220. Other than the method for attachment and electrical connection of chips 210 to sub-mount wafer 220, structure 200 is substantially the same as structure 100 as described above in regard to FIG. 1.

Although FIGS. 1 and 2 illustrate structures formed during one wafer-level packaging process, many variations of the disclosed process are possible. In particular, instead of attaching cap wafer 130 to a sub-mount wafer 120 or 220, separate caps can be formed and attached to the sub-mount wafer. This avoids the need to cut cap wafer 130 above external terminals 124, when external terminals 124 are on a front or top face of sub-mount wafer 120. Further, instead of a wafer-level process, similar techniques can be employed for a single package where a laser is enclosed in the cavity between a sub-mount and a cap having at least one integrated optical element.

Figure 3:
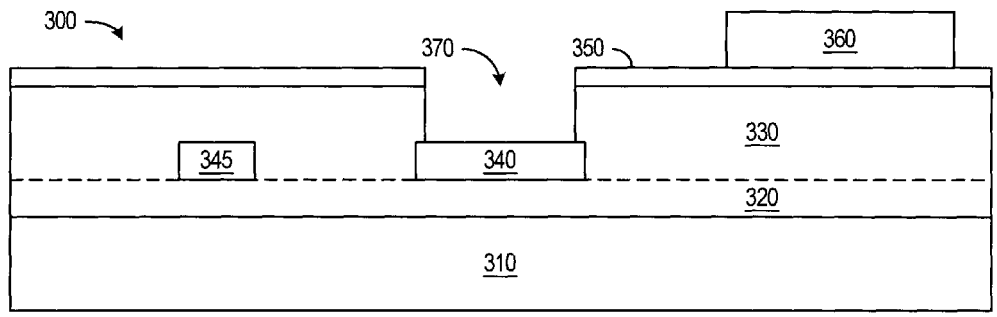
FIG. 3 shows a cross-section of a sub-mount for a semiconductor optical device assembly in accordance with an embodiment of the invention.

FIG. 3 shows a cross-section of a sub-mount 300 for an optical device package in accordance with an illustrative embodiment of the invention. For a wafer-level packaging process, sub-mount 300 would be part of a sub-mount wafer and is only separated from other similar sub-mounts after bonding the sub-mount wafer as described above. Alternatively, for fabrication of a single package, sub-mount 300 can be separated from other similar sub-mounts before an optical device is attached to sub-mount 300.

Sub-mount 300 can be fabricated using wafer processing techniques such as those described in a co-filed U.S. Pat. App. No. 10/666,442, entitled "Integrated Optics And Electronics". In the illustrated embodiment, sub-mount 300 can either be a processed or unprocessed silicon substrate and could incorporate passive and/or active circuit components.

A planarized insulating layer 330 is formed on silicon substrate 310 to provide a flat surface on which the metallization can be patterned. Openings can be formed in insulating layer 330 if electrical connections to circuit elements integrated in substrate 310 are desired. In an exemplary embodiment of the invention, layer 330 is a TEOS (tetra-ethyl-ortho-silicate) layer about 10,000 Å thick.

Conductive traces 340 and 345 can be patterned out of a metal layer, e.g., a 10,000-Å thick TiW/AlCu/TiW stack. In an exemplary embodiment, a process including evaporating metal and a lift-off process to remove unwanted metal forms traces 340 and 345. An insulating layer 330 (e.g., another TEOS layer about 10,000 Å thick) can be deposited to bury and insulate traces 340 and 345. Any number of layers of buried traces can be built up in this fashion. A passivation layer 350 of a relatively hard and chemical resistant material such as silicon nitride in a layer about 4500 Å thick can be formed on the top insulating layer 335 to protect the underlying structure. Openings 370 are formed through layers 350 and 330 to expose selected areas (e.g., bonding pads) of traces 340 for electrical connection to an optoelectronic device.

For bonding/soldering to a cap, a metal layer 360 (e.g., a Ti/Pt/Au stack about 5,000 Å thick) is formed on passivation layer 350.

Figure 4:
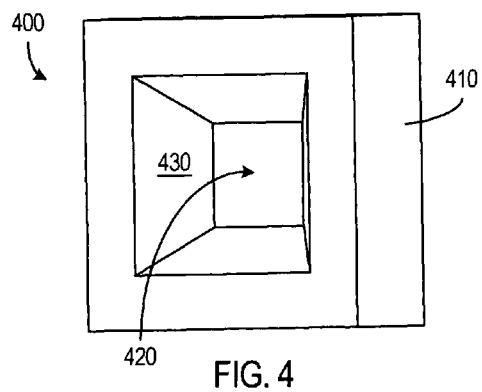
FIG. 4 is a perspective view of a cap for a semiconductor optical device package in accordance with alternative embodiments of the invention.

FIG. 4 shows a perspective view of a cap 400 suitable for attachment to sub-mount 300 of FIG. 3. Cap 400 can be fabricated using standard wafer processing techniques. In an exemplary embodiment of the invention, anisotropic etching of a silicon substrate 410 forms a cavity 420, which has a very smooth facet 430 on a <111> plane of the silicon crystal structure. An optical element such as a lens can be formed in cavity 420.

Figure 5A:
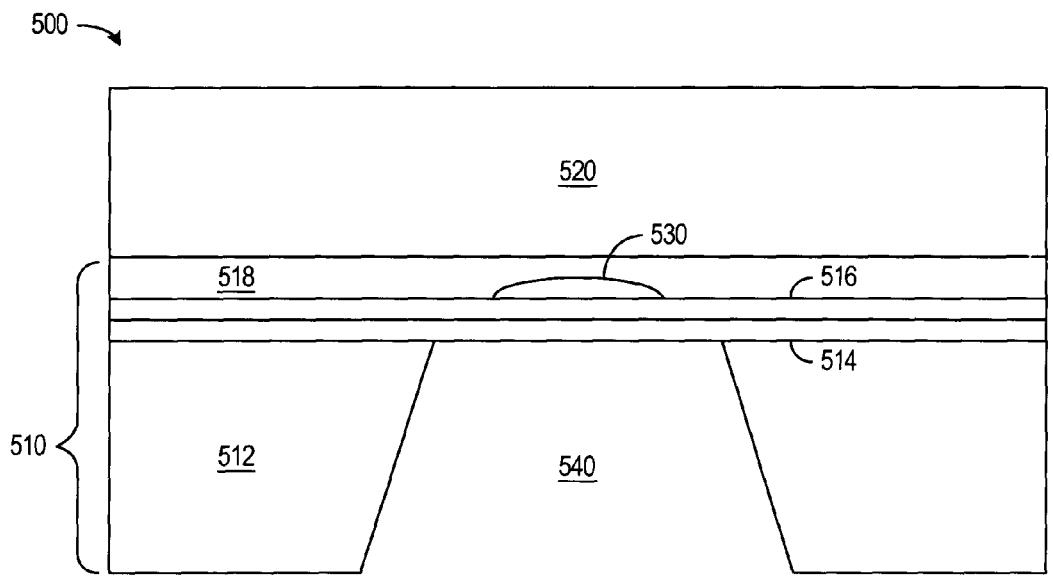
FIGS. 5A, 5B, and 5C illustrate a process for fabricating a cap in accordance with an embodiment of the invention.

FIG. 5A shows a cross-sectional view of a cap 500 in accordance with an alternative embodiment of the invention. Cap 500 has a two-part structure including a standoff ring 512 and a backing plate 520. An advantage of cap 500 is that the two layers 512 and 520 can be processed differently and/or made of different materials. In particular, standoff ring 512 can be fabricated using standard silicon wafer processing, and plate 520 can be made of a material such as glass that is transparent to a desired light wavelength. This is important because current VCSELs typically produce light having a wavelength (e.g., 850 nm) that silicon absorbs, and wafers made of materials such as glass (e.g., containing sodium) may be unsuitable for many silicon wafer fabrication facilities.

Figure 5B:
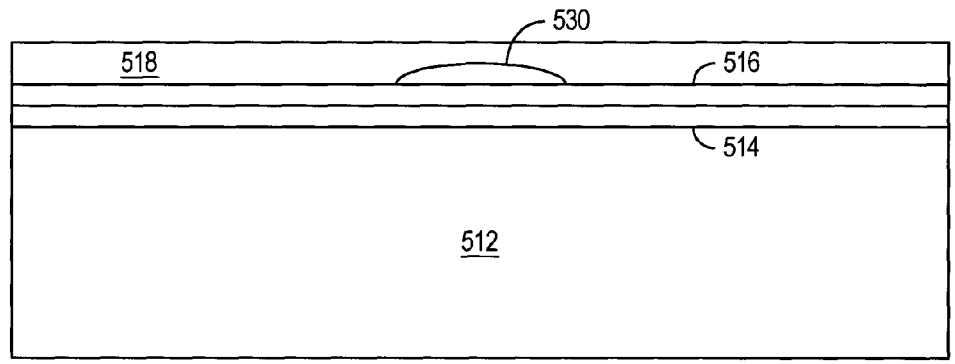

FIG. 5B illustrates a structure formed during the fabrication of an optical element 530. The fabrication process begins with a thin silicon substrate 512 (e.g., a 275 µm thick silicon wafer). An etch stop layer 514 of silicon dioxide ($SiO_2$) or other material capable of acting as an etch stop for silicon is formed to a thickness of about 0.5 µm.

A thin polysilicon layer 516 (e.g., about 1 µm or less) is then deposited on etch stop layer 514. Polysilicon layer 516 acts as a base for formation of an optical element 530 but is thin enough to be transparent to the wavelength of light emitted from the laser being packaged. In an example, lens 530 is formed on layer 516, for example, by building up alternating layers of polysilicon and oxide to achieve the desired shape or characteristics of a diffractive or refractive lens. A co-filed U.S. Pat. App. No. 10/666,444, entitled "Methods to Make Diffractive Optical Elements", describes some suitable processes for fabrication of lens 530.

Figure 5C:
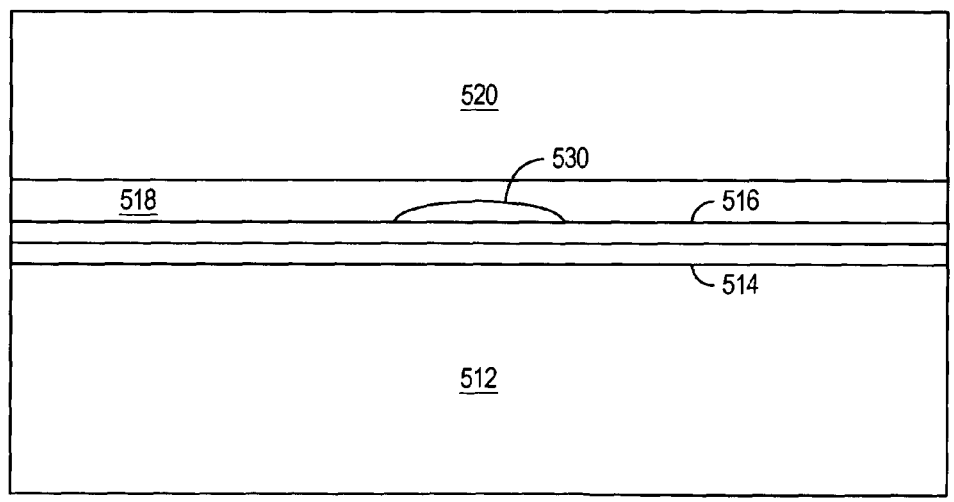

A planarized transparent layer 518 of a material such as TEOS is deposited over lens 530 to provide a flat surface for bonding to glass backing plate 520. As shown in FIG. 5C, backing plate 520 is bonded to layer 518, for example, by anodic bonding when backing plate 520 is a sodium glass plate. Finally, a portion of the back side of substrate 512 is etched down to etch stop layer 514 to form a cavity 540 as illustrated in FIG. 5A. The thickness of silicon remaining above cavity 540 is thin and permits light of the desired wavelength to traverse optical element 530.

Bonding of plate 520 and etching of substrate 512 would generally be completed at the wafer level, where a large number of caps 500 are simultaneously formed. Separate caps 500 can then be cut from the bonded wafers either before or after bonding to a sub-mount.

To assemble an optical device package using sub-mount 300 and cap 400 or 500, an optoelectronic device is mounted on sub-mount 300 using conventional die attach and wire-bonding processes or alternatively flip-chip packaging processes. Electrical connections to traces 340 on sub-mount 300 can supply power to the chip and convey data signals to or from the chip. Cap 400 or 500 attaches to sub-mount 300 after the chip is attached. This can be done either at the single package level or at a wafer level as described above. A hermetic seal can be obtained by patterning AuSn (or other solder) onto the sub-mount 300 and/or the cap 400 or 500, so that when the cap and sub-mount are placed together, a solder reflow process creates a hermetic seal protecting the enclosed chip.

Figure 6:
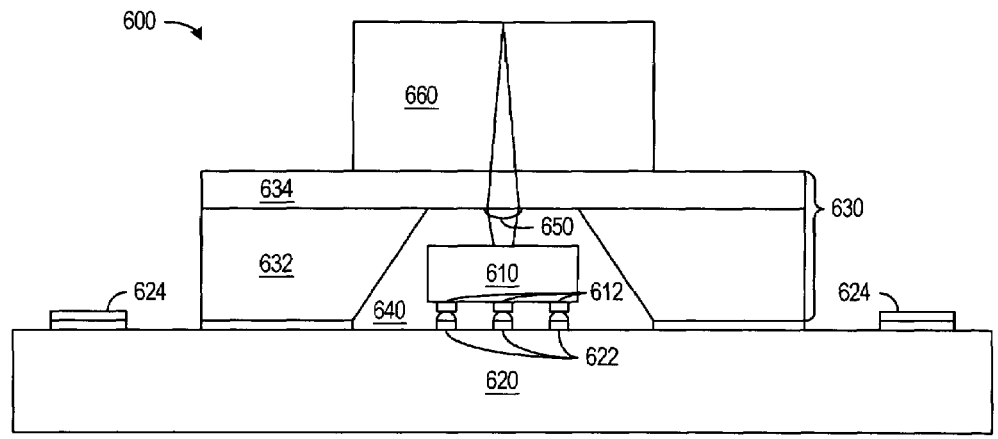
FIG. 6 shows a cross-section of an optical sub-assembly (OSA) including a surface emitting laser and a cap with an integrated optical element and an alignment post.

FIG. 6 illustrates an optical sub-assembly (OSA) 600 in accordance with an embodiment of the invention. OSA 600 includes a surface-emitting laser 610. Laser 610 is mounted on and electrically connected to a sub-mount 620 and is preferably hermetically sealed in a cavity 640 when a cap 630 is bonded to sub-mount 620. FIG. 6 shows an embodiment where flip-chip techniques electrically connect bonding pads 612 of chip 610 to respective conductive bumps 622 on sub-mount 620. Alternatively, wire bonding as described above could be used to connect a VCSEL to a sub-mount.

Sub-mount 620 is a substrate that is processed to include external terminals 624 for external electrical connections to laser 610. In one embodiment, sub-mount 620 includes traces as illustrated in FIG. 3 that provide direct electrical connections between conductive bumps 622 and external bonding pads 624. Alternatively, sub-mount 620 can further include active circuitry for use with laser 610 or other chips (e.g., a receiver or a monitor photodiode) that may be included in the same package.

Cap 630 can be bonded to sub-mount 620 using any of the techniques described above, and in a exemplary embodiment, solder bonds cap 630 to sub-mount 620. As a result, laser 610 can be hermetically sealed in a cavity 640 between cap 630 and sub-mount 620.

As illustrated in FIG. 6, cap 630 is multi-layer structure including a spacer ring 632 and a lid plate 634 such as described above in regard to FIG. 5. An optical device 650 is integrated into plate 634. Laser 610 directs the optical signal directly through optical device 650 and cap 630. In an exemplary embodiment of the invention, an optical element 650 is a diffractive or refractive lens (e.g., a bifocal diffractive lens) that focuses the optical signal for coupling into an optical fiber.

A post 660 is attached (e.g., epoxied or glued) to cap 630 at the location where the light exits cap 630. Post 660 acts as an alignment feature that aligns the light emitted from the opto electronic device 610 to an optical fiber. In one embodiment of the invention, post 660 is a hollow cylinder having an inner diameter larger than the beam profile. Post 660 can thus be made of any suitably durable material such as metal. Alternatively, post 660 can be a solid structure such as a cylinder or a sphere of an optically transparent material. Alignment posts for packages containing optical devices are further described in a co-filed U.S. Pat. App. Ser. No. 10/666,319, entitled "Alignment Post for Optical Subassemblies Made With Cylindrical Rods, Tubes, Spheres, or Similar Features".

Figure 7:
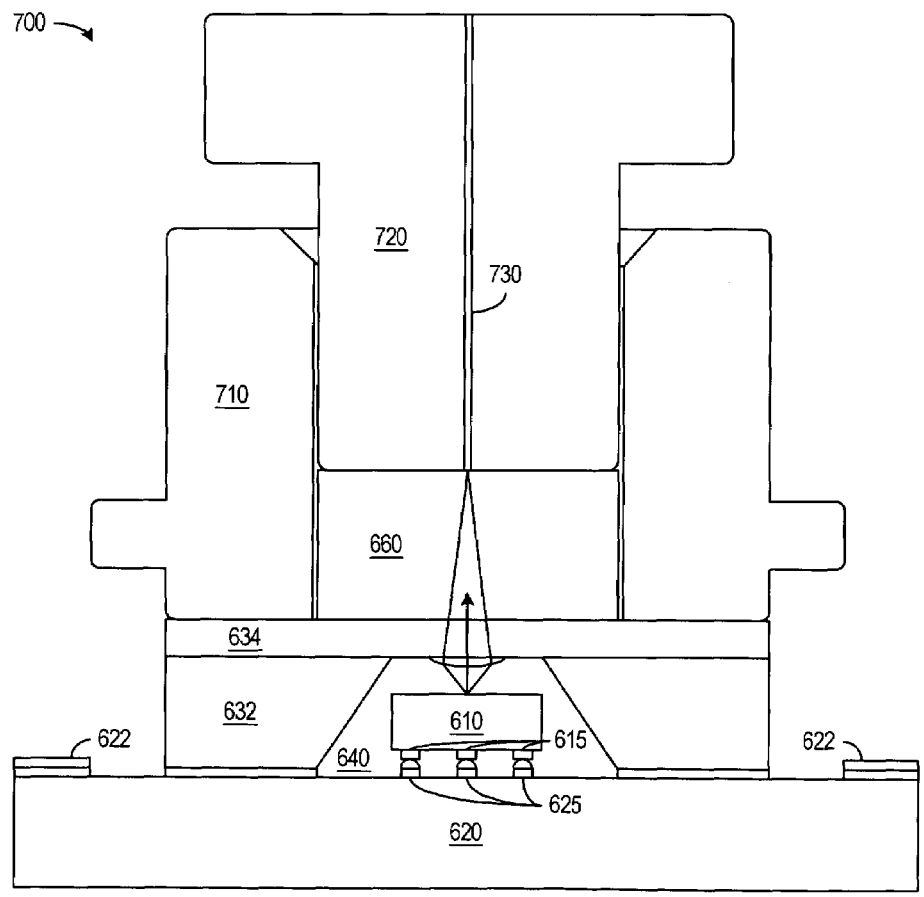
FIG. 7 illustrates an optical assembly including the OSA of FIG. 6.

FIG. 7 shows an optical assembly 700 containing OSA 600. Assembly 700 includes a sleeve 710 surrounding a ferrule 720 that houses an optical fiber 730. Ferrule 720 and optical fiber 730 can be portions of a conventional optical fiber connector that is only partly illustrated in FIG. 7. Sleeve 710 is basically a hollow cylinder made of a metal or other suitably durable material, and has a bore that accepts both post 660 of package 600 and ferrule 720.

The top surface of post 660 acts as a fiber stop and controls the "z" position of optical fiber 730 relative to the optical transmitter (i.e., VCSEL 610). The outside diameter of post 660 dictates the position in an x-y plane of sleeve 730. In this way, optical fiber 730 in ferrule 720 is centered in the x-y plane relative to post 660, thereby centering the light emitted from chip 610 on optical fiber. Accordingly, proper positioning of a post 660 having the desired length during manufacture of package 600 simplifies alignment of optical fiber 720 for efficient coupling of the optical signal.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. An optical device package comprising:
   a device that emits an optical signal from a major surface of the device;
   a sub-mount containing electrical traces that are electrically connected to the device;
   a cap attached to the sub-mount so as to form a cavity enclosing the device;
   an optical element residing within the cavity on an interior surface of the cap and in a path of the optical signal; and
   an alignment post glued to an exterior surface of the cap and aligned with the path of the optical signal.

2. The package of claim 1, wherein the device comprises a VCSEL.

3. The package of claim 1, wherein the sub-mount comprises a semiconductor substrate.

4. The package of claim 1, wherein flip-chip bonding electrically connects bonding pads on a front face of the device to the electrical traces in the sub-mount, and the optical signal emerges from a back face of the device.

5. The package of claim 1, the cap comprises a semiconductor substrate.

6. The package of claim 1, wherein bonding of the cap to the sub-mount hermetically seals the cavity.

7. The package of claim 1, wherein the alignment post is glued to the cap where the optical signal emerges from the cap.

8. The package of claim 7, wherein the alignment post comprises a hollow cylinder having an inner diameter larger than a beam profile of the optical signal.

9. The package of claim 1, wherein the optical element comprises a lens.

* * * * *